United States Patent [19]
Araki et al.

[11] Patent Number: 5,366,815
[45] Date of Patent: Nov. 22, 1994

[54] MAGNETIC MULTILAYER AND MAGNETORESISTANCE EFFECT ELEMENT

[75] Inventors: Satoru Araki; Kiyomi Yasui, both of Tokyo; Yoshikazu Narumiya, Chiba, all of Japan

[73] Assignee: TDK Corporation, Tokyo, Japan

[21] Appl. No.: 65,443

[22] Filed: May 24, 1993

Related U.S. Application Data

[63] Continuation of Ser. No. 741,332, Aug. 7, 1991, abandoned.

[30] Foreign Application Priority Data

Mar. 22, 1991 [JP] Japan .................................. 3-083290
Jul. 1, 1991 [JP] Japan .................................. 3-186906

[51] Int. Cl.$^5$ .......................... H01F 1/00; B32B 15/01
[52] U.S. Cl. .................................... 428/611; 428/635; 428/928
[58] Field of Search ............... 148/DIG. 48, 900, 306, 148/310, 311, 312, 313; 428/611, 635, 928

[56] References Cited

U.S. PATENT DOCUMENTS

| | | | |
|---|---|---|---|
| 3,350,180 | 10/1967 | Croll | 428/928 |
| 3,479,156 | 11/1969 | Ginder | 428/928 |
| 4,837,118 | 6/1989 | Yamamoto et al. | 428/645 |
| 4,935,311 | 6/1990 | Nakatani et al. | |
| 4,978,584 | 12/1990 | Reim et al. | 428/611 |

OTHER PUBLICATIONS

Vossen et al., Thin Film Processes, pp. 14–16 1978.
Applied Physics A: Solids & Surfaces, vol. 49, No. 5, pp. 513–518 and 521, Nov., 1989, J. J. Krebs, "Ultrathin Film Magnetic Research at the Naval Research Laboratory".
Applied Physics Letters, vol. 55, No. 21, pp. 2239–2241, Nov. 20, 1989, P. Etienne, et al., "Critical Steps in the Molecular Beam Epitaxy of High Quality Ag/Fe Superlattices on (001) GaAs".
IEEE Transactions on Magnetics, vol. 26, No. 5, pp. 2747–2749, Sep. 1990, B. A. Gurney, et al., "Influence of Au and Ag at the Interface of Sputtered Giant Magnetoresistance Fe/Cr Multilayers".
1990 Digests of Intermag '90, International Magnetics Conference, H. Szymczak, et al., "Magnetostriction of Multilayer Co/Ag Films", Apr. 17–20, 1990.
Japan Applied Magnetic Conference, 1986, S. Ishio, et al., "Magnetic Properties of Co—(Cr, Ag) and Mn-Ge Multilayer Films".
Journal of Magnetism and Magnetic Materials, vol. 93, 1991, pp. 480–484, D. H. Mosca, et al., "Magnetoresistance of Co-Based Multi-Layered Structures".
Journal of Magnetism and Magnetic Materials, vol. 83, 1990, pp. 65–66, R. Krishnan, et al., "Magnetic Studies of Co/Ag Multilayers".
Proceedings ICF-5, 1989, pp. 491–497, R. Krishnan, et al., "Torque and FMR Studies in Co-Ag Multilayers".
J. Slaughter, "Electron Properties of Ag/Co Layered Metallic Films", Proc. 18th Int. Conf. on Low Temp. Physics, Kyoto 1987 Japanese Journ. of Appl. Physics, vol. 26 (1987) Suppl. 26-3, pp. 1451–1452.
Parkin et al, "Oscillations in Exchange . . . Co/Ru, Co/Cr, and Fe/Cr", Physical Review Letters, vol. 64, No. 19, The American Physical Society, 1990, pp. 2304–2307.

(List continued on next page.)

Primary Examiner—Michael Lewis
Assistant Examiner—Stephen G. Kalinchak
Attorney, Agent, or Firm—Oblon, Spivak, McClelland, Maier & Neustadt

[57] ABSTRACT

A magnetic multilayer is an alternate stack of a plurality of magnetic thin films containing Fe, Co or Ni and a plurality of Ag thin film. Both the films are formed by molecular beam epitaxy to a thickness of 2 to 60 Å. The multilayer has an axis of easy magnetization in a plane parallel to the surface and an in-plane squareness ratio of 0.5 or lower and exhibits antiferromagnetism. The multilayer shows giant magnetoresistance change in low magnetic fields, for example, a magnetoresistance change of 1 to 40% in a magnetic field of 0.01 to 20 kOe.

9 Claims, 12 Drawing Sheets

OTHER PUBLICATIONS

Baibich et al, "Giant Magnetoresistance of (001)Fe/(001)Cr...", Physical Review Letters, American Physical Society, vol. 61, No. 21, Nov. 21, 1988, pp. 2472-2473.

Sato et al, "Galvanomagnetic Properties of Ag/M... Metallic Films", Superlattices and Microstructures, vol. 4, No. 1, 1988, pp. 45-50.

Journal of Japan Applied Magnetism Society, 13, pp. 335-338, (1989).

Journal of Applied Magnetism Society, 13, pp. 339-342, (1989).

Slaughter, et al., Electron Transport Properties of Ag/Co Layered Metallic Films, 1987, Japn. Journl. of Appl. Physics, pp. 1451-1452.

MAGNETIC MULTILAYER AND MAGNETORESISTANCE EFFECT ELEMENT

This application is a continuation of application Ser. No. 07/741,332, filed on Aug. 7, 1991, now abandoned.

This invention relates to a magnetic multilayer structure and a magnetoresistance effect element (MR element) using the same.

BACKGROUND OF THE INVENTION

MR elements including various magnetic sensors (MR sensors) and magnetic heads (MR heads) are to detect a change in electric resistance produced in a magnetic film on application of a magnetic field to thereby measure the magnetic field intensity or its change. They are generally required to have a great differential magnetoresistance and a low operating magnetic field intensity at room temperature.

Prior art MR elements used magnetic films of Fe-Ni (Permalloy) and Ni-Co alloys in order to take advantage of their anisotropic magnetoresistance effect. The Fe-Ni and Ni-Co alloys can operate with a low magnetic field intensity, but have a differential magnetoresistance as low as 2 to 5%.

With the advance of the modern thin film technology, artificial superlattices were developed using a molecular beam epitaxial (MBE) method. Each artificial superlattice has a multilayered structure including thin metal layers having a thickness of an atomic order stacked at regular intervals using a molecular beam epitaxial (MBE) method and exhibits different properties from bulk metal.

One of recently developed artificial superlattices is a giant magnetoresistance changing material in the form of an Fe/Cr magnetic multilayer comprising alternately stacked Fe and Cr films. In this multilayer, a pair of Fe films sandwiching a Cr film are magnetically coupled in antiparallelism. On application of an external magnetic field, Fe spins are gradually aligned in one given direction and accordingly, the resistance lowers. As a consequence, the multilayer shows a giant magnetoresistance change of 46% at 4.2K and 16% at room temperature (see Physical Review Letters, Vol. 61, page 2472, 1988). The Fe/Cr magnetic multilayer has such a giant magnetoresistance change, but requires an operating magnetic field intensity of about 20 kOe, which imposes some limitations on the multilayer in practical use.

Active research efforts were concentrated on the artificial lattice magnetic multilayers exhibiting antiferromagnetism. Up to the present, interlaminar coupling of antiferromagnetic spins was discovered in Co/Cr and Co/Ru magnetic multilayers (see Physical Review Letters, Vol. 64, page 2304, 1990). The magnetoresistance change is undesirably as low as 6.5% at 4.5K for the Co/Cr system and 6.5% at 4.5K for the Co/Ru system.

SUMMARY OF THE INVENTION

A primary object of the present invention is to provide a novel and improved magnetic multilayer having a giant magnetoresistance change and requiring a low operating magnetic field intensity to provide such a giant magnetoresistance change.

Another object of the present invention is to provide a novel and improved magnetic multilayer capable of varying the operating magnetic field intensity at which a giant magnetoresistance change is available.

A further object of the present invention is to provide a magnetoresistance effect element using such a magnetic multilayer.

According to the present invention, there is obtained a magnetic multilayer structure having a surface comprising a plurality of magnetic thin films containing at least one member selected from the group consisting of Fe, Co, and Ni, and a plurality of Ag thin films stacked one on top of another. In one aspect, the multilayer is defined as having an axis of easy magnetization in a plane parallel to the surface and a squareness ratio $Br/Bs$ in the plane of up to 0.5. In another aspect, the multilayer is defined as exhibiting antiferromagnetism.

Preferably, the magnetic thin films and the Ag thin films are formed by a molecular beam epitaxial method. Preferably, the magnetic thin films have a thickness of 2 to 60 Å, and the Ag thin films have a thickness of 2 to 60 Å.

Also contemplated herein is a magnetoresistance effect element comprising a magnetic multilayer as defined above.

Journal of Japan Applied Magnetism Society, 13, 335–338 (1989) discloses artificial superlattice magnetic multilayers of Co/Ag and Fe/Ag systems using a high frequency sputtering method. Since these multilayers, however, utilize polar magnetic Kerr effect and have perpendicular magnetic anisotropy, they would show a low magnetoresistance change if built as MR elements. Japanese Journal of Applied Physics, Vol. 26, Supplement 26-3, 1451 (1987) also reports an artificial lattice magnetic multilayer of Co/Ag system using a sputtering method. As to this multilayer, the electric resistance (sheet resistivity) and its dependency on Co and Ag lamination order are mainly discussed while no reference is made to antiferromagnetism and magnetoresistance change.

Superlattices and Microstructures, Vol. 4, No. 1, 45 (1988) reports magnetic multilayers of Fe, Co or Ni films and Ag films prepared by sputtering while their Hall coefficient and magnetoresistance effect are discussed. The magnetoresistance effect of Co/Ag discussed therein is attributable to the magnetic domain structure of Co that magnetic domains are randomly oriented in a weak magnetic field applied and is thus essentially different from a giant magnetoresistance change due to antiferromagnetism as found in the present invention.

Further, Journal of Japan Applied Magnetism Society, 13, 339–342 (1989) discloses an artificial lattice magnetic multilayer of Co/Au system using a molecular beam epitaxial method. This multilayer has vertical magnetic anisotropy and a magnetoresistance change as low as 1% at 0.5 kOe and room temperature.

DETAILED DESCRIPTION OF THE INVENTION

Figure 1:
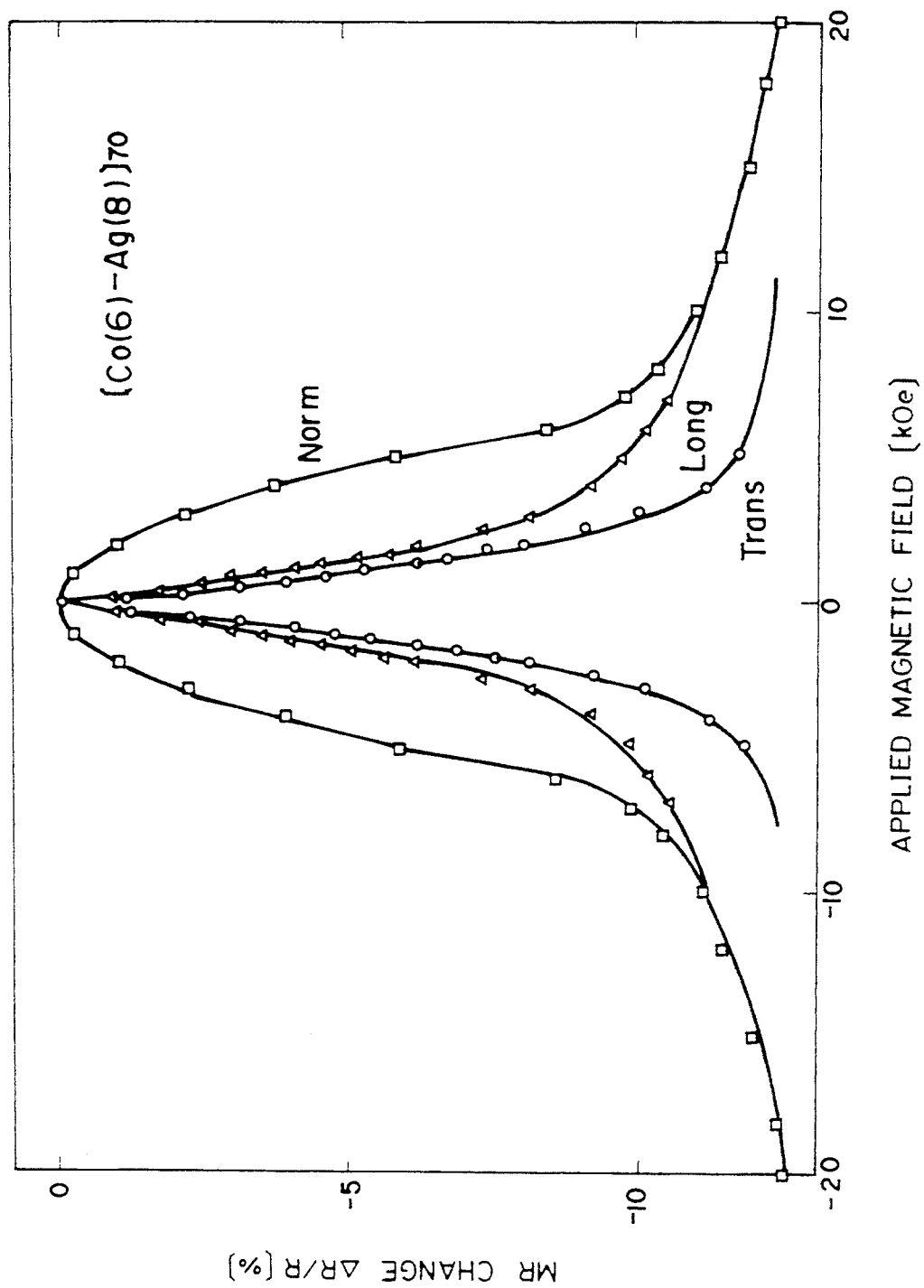
FIG. 1 is a diagram showing a magnetoresistance change $\Delta R/R$ of a magnetic multilayer of Example 1 relative to a magnetic field applied in transverse, longitudinal and normal directions.

The magnetic multilayer of the present invention includes a plurality of magnetic thin films containing an iron group element and a plurality of non-magnetic intervening layers in the form of Ag thin films on a substrate. The magnetic thin films and Ag thin films are alternately stacked on the substrate.

Each of the magnetic thin films contains at least one element selected from Fe, Co and Ni. The magnetic film is preferably formed of Fe, Co or Ni alone or an alloy of two or three of Fe, Co and Ni. It is also acceptable to form the magnetic film from an alloy containing at least 30 at % of Fe, Co, Ni or a mixture of two or three of them. The magnetic film preferably has a thickness of up to 60 Å, more preferably up to 50 Å, especially up to 40 Å, most preferably up to 20 Å. In excess of 60 Å in thickness, a giant magnetoresistance change would not be available since magnetic elements in adjacent films would be spaced a relatively large enough distance to cancel antiferromagnetic coupling. The magnetic film should preferably be at least 2 Å, more preferably at least 4 Å thick. In a film of less than 2 Å thick, magnetic elements would not be continuously and closely arranged in the plane of formation, resulting in a loss of ferromagnetism.

Each of the Ag thin films is a film consisting essentially of Ag, preferably a film consisting solely of Ag. The Ag film preferably has a thickness of up to 60 Å, more preferably up to 50 Å, most preferably up to 45 Å. If the intervening Ag film is more than 60 Å thick, magnetic films would be spaced a relatively large distance so that antiferromagnetic coupling would be lost. The Ag film should preferably be at least 2 Å thick. If the Ag film is less than 2 Å thick, it cannot be continuous with its function as a nonmagnetic intervening layer lost.

In the magnetic multilayer of the present invention, the magnetic exchange coupling energy periodically oscillates and varies with the repetition interval of the magnetic layers, typically a change in the thickness of the Ag films. We first discovered this fact with regard to MBE grown artificial lattice magnetic multilayers although it was recently reported with regard to sputtered magnetic multilayers.

More particularly, oscillatory magnetic exchange coupling mainly depends on the thickness of Ag thin films. As the thickness of Ag thin films is varied over the range of from 2 to 60 Å, saturation magnetic field applied, Hsat, varies periodically in the range of from 1 to 10 kOe. The maximum and minimum of Hsat also vary. At the same time, the magnetoresistance change varies and oscillates periodically. There is a range of Ag film thickness at which a giant magnetoresistance change of more than 10%, especially more than 16% and even approaching 20% at room temperature is available. As a result, by selecting the thickness of the Ag films in the range of 2 to 60 Å, there is obtained freedom of design for magnetic multilayers having a magnetoresistance change of 1 to 20% at room temperature in an operating magnetic field of 0.01 to 20 kOe in intensity.

It is to be noted that the thickness of the magnetic thin films and Ag thin films can be measured by means of a transmission or scanning electron microscope and Auger electron spectroscopy and the grain structure can be identified by X-ray diffraction and reflection high energy electron diffraction (RHEED).

In the magnetic multilayer of the present invention, the number of magnetic films stacked and the number of recurring magnetic film/Ag film units are not particularly limited and may be suitably chosen for the desired magnetoresistance change and the like. Preferably, the number of recurring units is 2 or more, more preferably 8 or more in order to provide an acceptable magnetoresistance change. In general, a larger number of recurring units is preferred because a more proportion of free electrons are subject to scattering. However, an extremely increased number of recurring units often results in deteriorated film quality and no further property improvement. Thus the maximum number of recurring units is preferably limited to 500, especially 200. It is to be noted that a long period superlattice structure can be identified by taking a small angle X-ray diffraction pattern where primary and secondary peaks corresponding to recurring periodicities appear.

Figure 3:
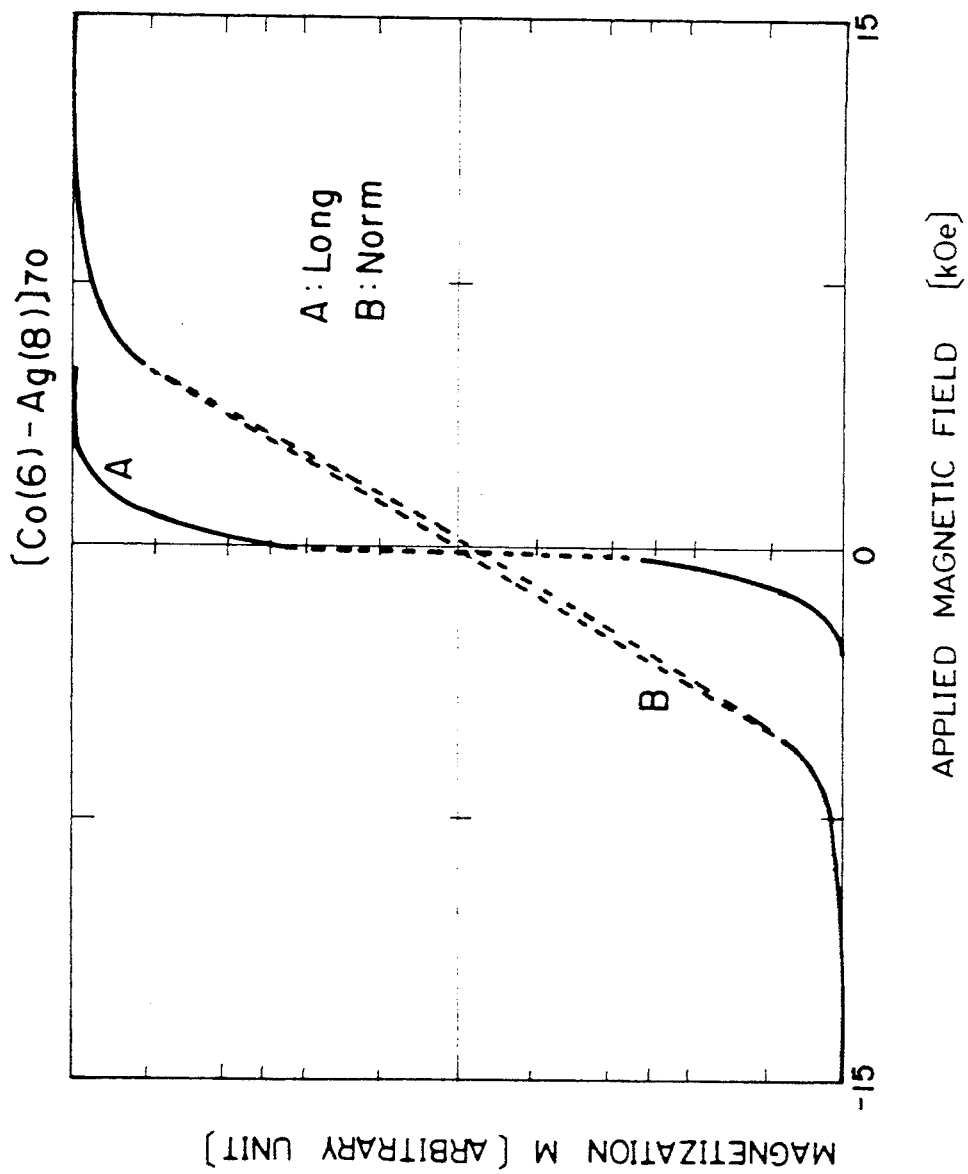
FIG. 3 shows magnetization curves of a magnetic multilayer of Example 1 relative to a magnetic field applied in in-plane and normal directions.

As a result of interlaminar antiferromagnetic coupling between magnetic thin films, the magnetic multilayer of the invention exhibits antiferromagnetism. The antiferromagnetism can be readily identified by polarized neutron diffraction, for example. As a result of antiferromagnetism, the multilayer has a squareness ratio Br/Bs of up to 0.5, especially up to 0.3, and even approaching zero when a magnetization versus applied magnetic field curve or B-H loop of the multilayer is measured in a plane parallel to its surface by means of a vibrating sample magnetometer (VSM) or B-H tracer. The magnetization versus applied magnetic field curve or B-H loop has closely spaced magnetizing and demagnetizing curve segments. Further measurement of ease of magnetization or anisotropic energy in a plane parallel or normal to the multilayer surface by means of a VSM, B-H tracer or torque magnetometer indicates that the multilayer has an axis of easy magnetization within a plane parallel to the multilayer surface. FIG. 3 shows magnetization versus applied magnetic field curves A and B in planes parallel and normal to the multilayer surface. If Br/Bs in the parallel plane exceeds 0.5, the multilayer would be subject to a drastic drop in the proportion of antiferromagnetism within its interior and a lowering of magnetoresistance change therewith.

The substrate on which the multilayer is formed may be formed of any desired materials including amorphous glass substrates and crystalline glass substrates as well as other commonly used substrates, for example, single crystal substrates of various oxides such as magnesium oxide, sapphire, silicon, gallium-arsenide, strontium titanate, barium titanate, and lithium niobate and polycrystalline substrates such as alumina-titanium carbide and calcium titanate. Although Fe/Cr systems present degraded properties on glass substrates, the multilayer of the present invention maintains fully acceptable properties even on glass substrates. A wide angle X-ray diffraction analysis shows that on a glass substrate, an Ag film has (111) orientation and a Co film has hcp (002) overlapping fcc (111) indicating polycrystalline nature. On an MgO substrate, Ag (200) and Co fcc (200) peaks are observed, indicating predominant (100) epitaxial growth.

As to the dimensions of the substrate, no limit is imposed and a choice may be made in accordance with a particular element to which the multilayer is to be applied. The surface of the substrate on which the magnetic multilayer is to be formed may be provided with an undercoat if desired.

On the surface of the uppermost layer may be provided an antioxidizing film of silicon nitride, silicon oxide, or other metals as well as a conductive metal layer for electrode tapping.

In the practice of the invention, the magnetic multilayer is preferably prepared by a molecular beam epitaxy (MBE) method. Since the magnetic films and Ag films are very thin, it is necessary to slowly deposit them. Film formation in a ultrahigh vacuum environment is necessary in order to avoid film contamination. In forming respective layers, depositing particles should have as low energy as possible for preventing interdiffusion from occurring with an attendant loss of antiferromagnetism. Best suited for these considerations is an MBE method.

The MBE method is a kind of ultra high vacuum deposition process causing molecules or substance evaporated from a source in ultrahigh vacuum to deposit on a substrate surface, thereby growing a film. More particularly, sources of magnetic and nonmagnetic materials are equipped with shutters. One of the two sources is selected by opening one shutter with the other shutter closed. Film thickness is monitored by means of a suitable film gauge. In this way, magnetic and nonmagnetic films are alternately deposited. For film formation, the ultimate pressure is generally about $10^{-11}$ to $10^{-9}$ Torr, and the materials are deposited under a pressure at about $10^{-11}$ to $10^{-7}$ Torr, especially about $10^{-10}$ to $10^{-7}$ Torr at a rate of about 0.01 to 10 Å/sec., especially about 0.1 to 1.0 Å/sec. The depositing particles will have a kinetic energy of 0.01 to 5 eV, preferably 0.01 to 1 eV, with its center energy ranging from 0.05 to 0.5 eV.

During film formation, the substrate may be heated if desired to obtain films of sound grain structure. To this end, the heating temperature should preferably be up to 800° C. in order to prevent interdiffusion between adjoining films. It is also possible to form magnetic films in a magnetic field to enhance in-plane magnetic anisotropy.

The magnetic multilayers of the invention are advantageously applicable to various MR elements including MR sensors and MR heads. On use, a biasing magnetic field is applied thereacross if needed. Also, the magnetic multilayers of the invention may be positioned in the gaps or tracks of a thin film type magnetic head so that reading operation can be conducted through the MR strips.

EXAMPLE

Examples of the present invention are given below by way of illustration and not by way of limitation.

EXAMPLE 1

On a single crystal magnesium oxide substrate, Co magnetic films and Ag films were alternately deposited. There was fabricated a magnetic multilayer sample consisting of 70 units each consisting of a Co film of 6 Å and a Ag film of 8 Å. This sample is designated [Co(6)-Ag(8)]×70. The thickness of each film was monitored by means of a transmission electron microscope.

For MBE vacuum deposition, a vacuum chamber having an ultimate pressure of $7 \times 10^{-11}$ Torr was used. Film deposition was conducted in an operating pressure of $9.7 \times 10^{-10}$ Torr and at a rate of about 0.5 Å/sec. while the substrate was rotated 30 r.p.m. and heated at 100° C. Depositing particles had a central kinetic energy of about 0.1 eV.

A magnetization versus applied magnetic field curve was measured by means of a vibrating sample magnetometer (VSM). Separately, the sample was cut into a strip of 0.3 mm×1.0 mm², which was measured for resistivity by a DC four terminal method while the external magnetic field was varied from −20 kOe to +20 kOe at the maximum, for determining a magnetoresistance (MR) change rate ΔR/R. For measurement, a current flow of 64 μA was longitudinally passed through the strip and the external magnetic field was applied in different directions. The magnetoresistance change ΔR/R is calculated based on the equation:

$$\Delta R/R = (Rmax - Rmin)/Rmin \times 100\%$$

wherein Rmax is the maximum resistivity and Rmin is the minimum resistivity.

FIG. 1 shows a magnetoresistance change ΔR/R relative to the applied field. Curve labeled Trans is the result obtained when an external magnetic field is applied in the sample plane and transverse to the current flow. Curve labeled Long is the result obtained when an external magnetic field is applied in the sample plane and parallel to the current flow. Curve labeled Norm is the result obtained when an external magnetic field is applied normal to the sample plane. As seen from the curved labeled Trans, the magnetoresistance change was 13.3% in an applied field of 5 kOe and 11.2% in an applied field of 3 kOe both at room temperature.

Figure 4:
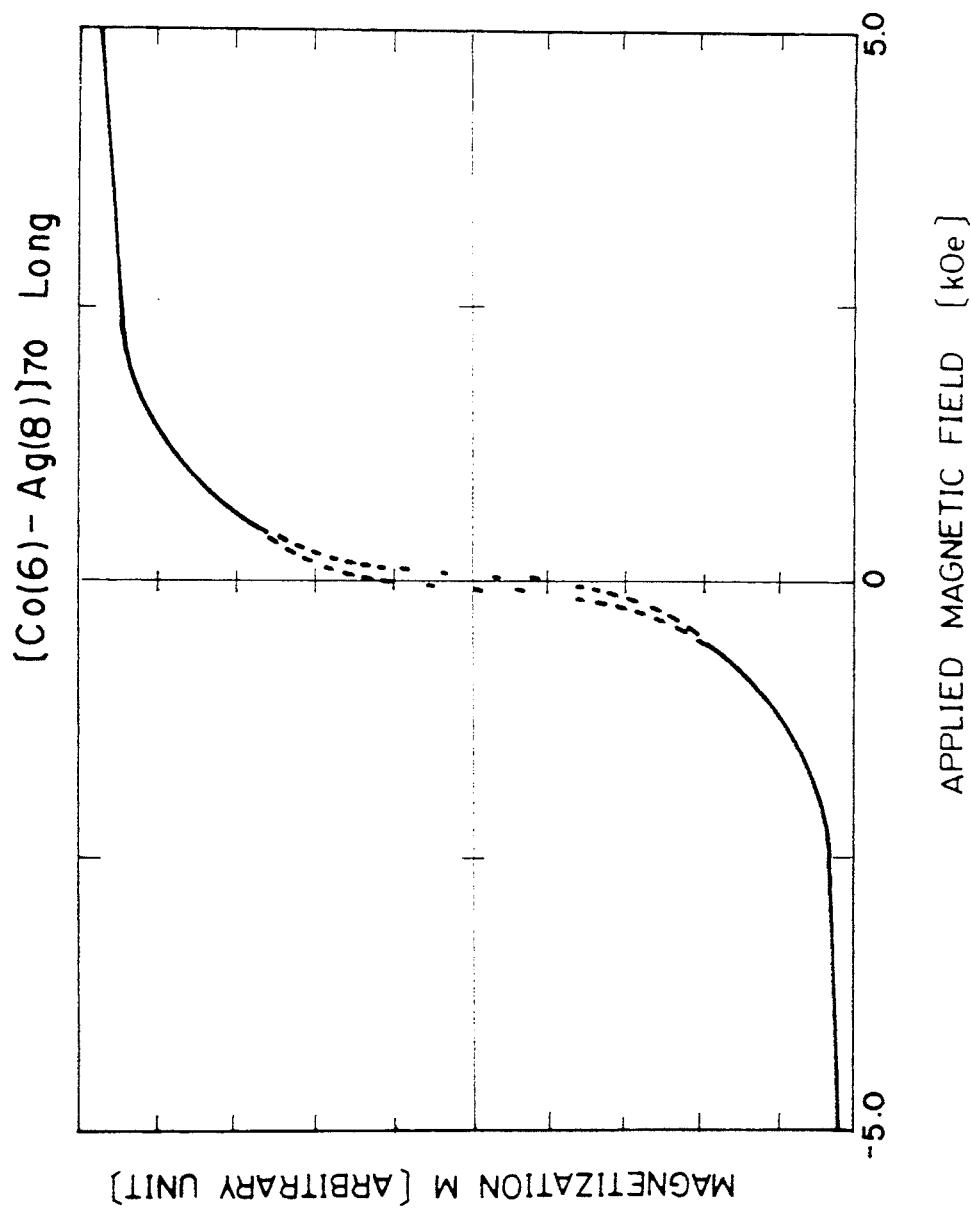
FIG. 4 shows in enlargement a magnetization curve of a magnetic multilayer of Example 1 relative to a magnetic field applied thereto.

A magnetization versus applied magnetic field curve with the field applied in a sample in-plane direction is shown in FIG. 3 as curve A and in FIG. 4. The squareness ratio was 0.1. It will be understood that curve B in FIG. 3 is a magnetization versus applied magnetic field curve with the field applied in a normal plane.

As seen from FIGS. 1, 3 and 4, the multilayer had an axis of easy magnetization within a plane parallel to the surface, a reduced squareness ratio, and antiferromagnetism. In fact, polarential neutron diffraction analysis also showed a diffraction line at a Bragg angle corresponding to twice the interval of the multilayer unit thickness, confirming interlaminar antiferromagnetic coupling.

EXAMPLE 2

A magnetic multilayer [Co(6)-Ag(8)]×70 was fabricated by repeating the procedure of Example 1 except that an amorphous glass substrate was used instead. This multilayer also had an axis of easy magnetization within a plane parallel to the surface, a squareness ratio Br/Bs of 0.1, and antiferromagnetism. The magnetoresistance change ΔR/R was 8.3% in an applied field of 7 kOe at room temperature and 19.4% in an applied field of 20 kOe at 77K.

EXAMPLE 3

As in Example 1, a magnetic multilayer [Co(10)-Ag(8)]×40 was fabricated on a magnesia substrate. The operating pressure was $7.9 \times 10^{-10}$ Torr. This multilayer also had an axis of easy magnetization within a plane parallel to the surface, a squareness ratio Br/Bs of 0.25, and antiferromagnetism. The magnetoresistance change ΔR/R was 14.3% in an applied field of 7 kOe at 77K when measured with a current flow of 132 μA.

EXAMPLE 4

As in Example 1, a magnetic multilayer [Co(15)-Ag(8)]×30 was fabricated on a magnesia substrate. The operating pressure was $2.1 \times 10^{-10}$ Torr. This multilayer also had an axis of easy magnetization within a plane parallel to the surface, a squareness ratio Br/Bs of 0.25, and antiferromagnetism. The magnetoresistance change ΔR/R was 12.8% in an applied field of 7 kOe at 77K when measured with a current flow of 145 μA.

EXAMPLE 5

Figure 2:
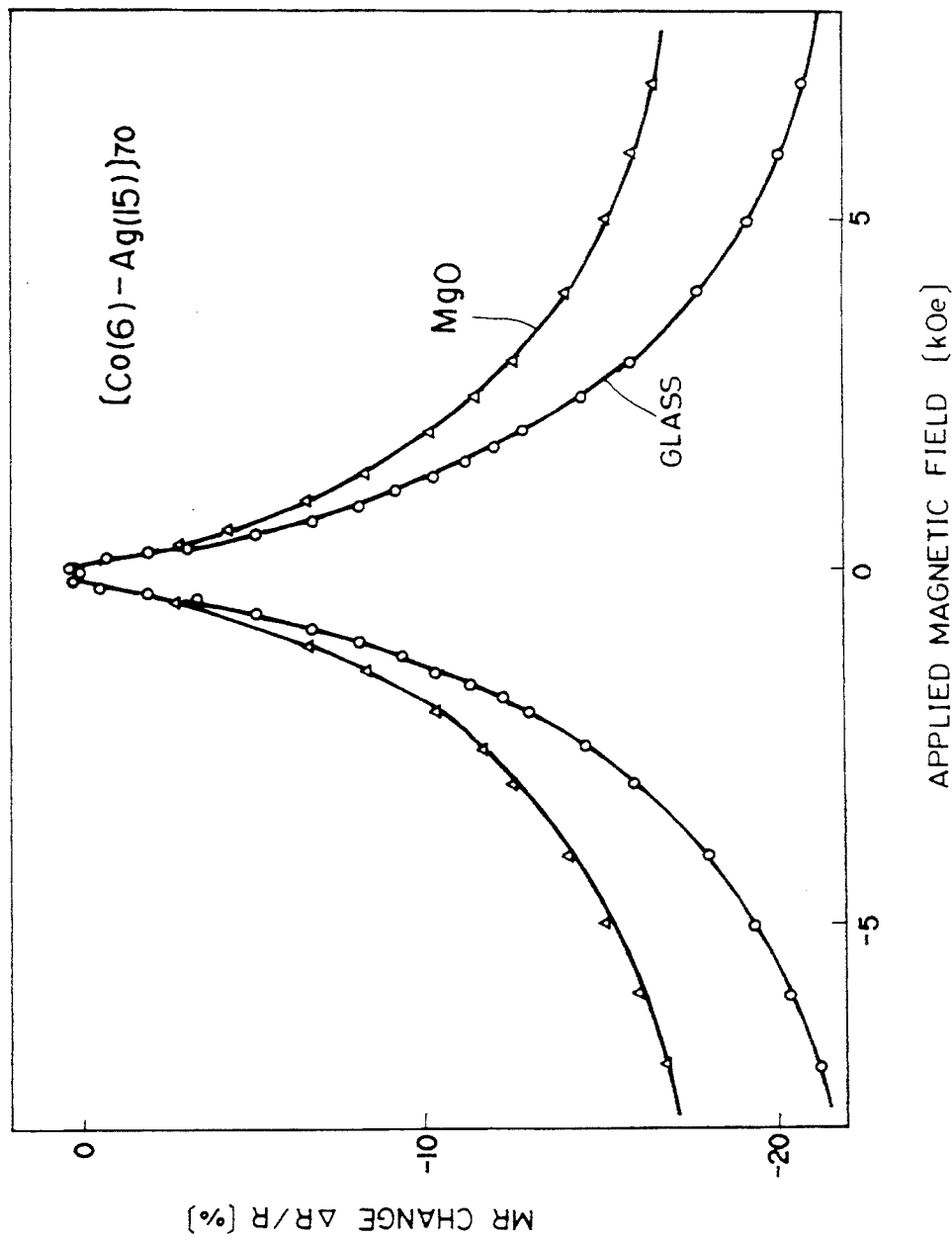
FIG. 2 is a diagram showing a magnetoresistance change $\Delta R/R$ of magnetic multilayers of Examples 5 and 6 relative to a magnetic field applied thereto, the multilayers being on glass and MgO substrates.
Figure 5:
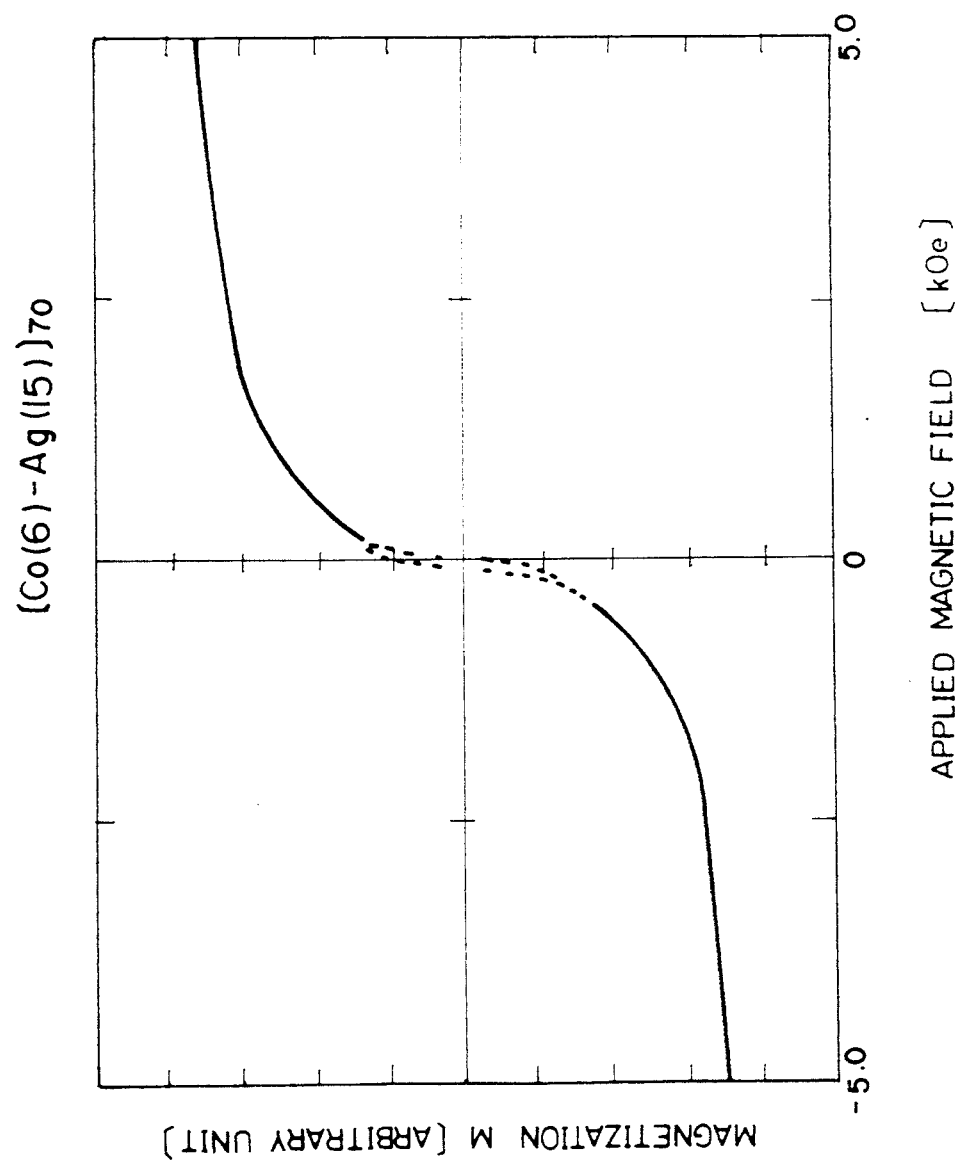
FIG. 5 shows a magnetization curve of a magnetic multilayer of Example 5 relative to a magnetic field applied thereto.

As in Example 1, a magnetic multilayer [Co(6)-Ag(15)]×70 was fabricated on a magnesia substrate. The operating pressure was $2.3 \times 10^{-10}$ Torr. This multilayer also had an axis of easy magnetization within a plane parallel to the surface, a squareness ratio Br/Bs of 0.25, and antiferromagnetism. The magnetoresistance change ΔR/R was 16.7% in an applied field of 7 kOe at 77K when measured with a current flow of 125 μA. FIG. 2 shows a magnetoresistance change ΔR/R (curve labeled MgO) and FIG. 5 shows a magnetization versus applied magnetic field curve.

EXAMPLE 6

A magnetic multilayer [Co(6)-Ag(15)]×70 was fabricated by repeating the procedure of Example 5 except that an amorphous glass substrate was used instead. This multilayer also had an axis of easy magnetization within a plane parallel to the surface, a squareness ratio Br/Bs of 0.1, and antiferromagnetism. The magnetoresistance change ΔR/R was 26.8% in an applied field of 7 kOe at 77K as measured with a current flow of 125 μA. The magnetoresistance change ΔR/R of this multilayer is shown in FIG. 2 as a curve labeled glass.

COMPARATIVE EXAMPLE 1

Figure 6:
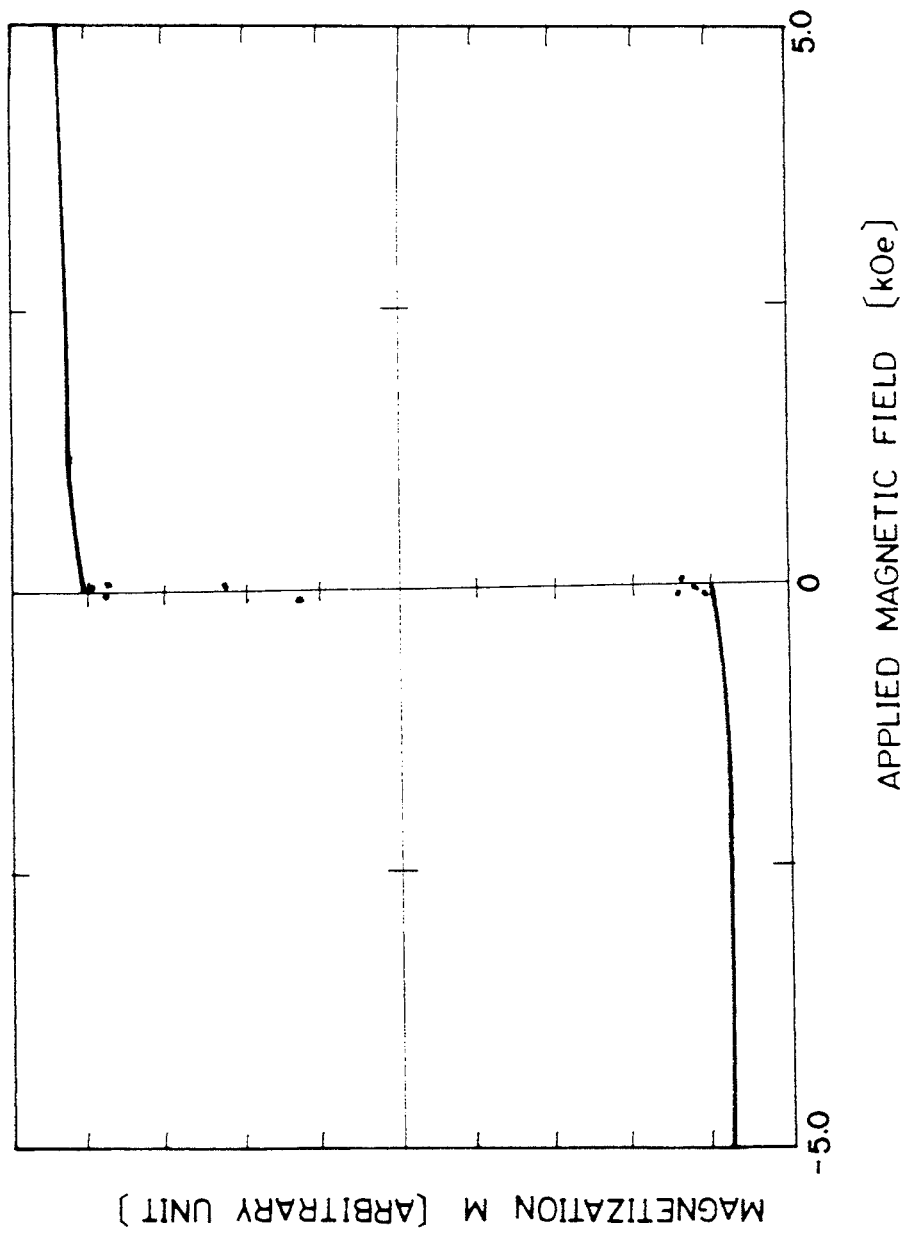
FIG. 6 shows a magnetization curve of a magnetic multilayer of Comparative Example 1 relative to a magnetic field applied thereto.

A magnetic multilayer [Co(50)-Ag(70)]×30 was fabricated on an amorphous glass substrate. The conditions included an ultimate pressure of $1.2 \times 10^{-10}$ torr, an operating pressure of $3.0 \times 10^{-9}$ Torr, and a substrate temperature of 100° C. This multilayer showed a magnetization versus applied magnetic field curve as shown in FIG. 6, indicating an in-plane squareness ratio Br/Bs of 0.9 and no antiferromagnetism. The magnetoresistance change was only 0.5% at 7 kOe and room temperature.

EXAMPLE 7

Magnetic multilayers [Co(6)-Ag(t)]×70 were fabricated in accordance with Example 1 while the thickness (t) of Ag films was varied.

Figure 7:
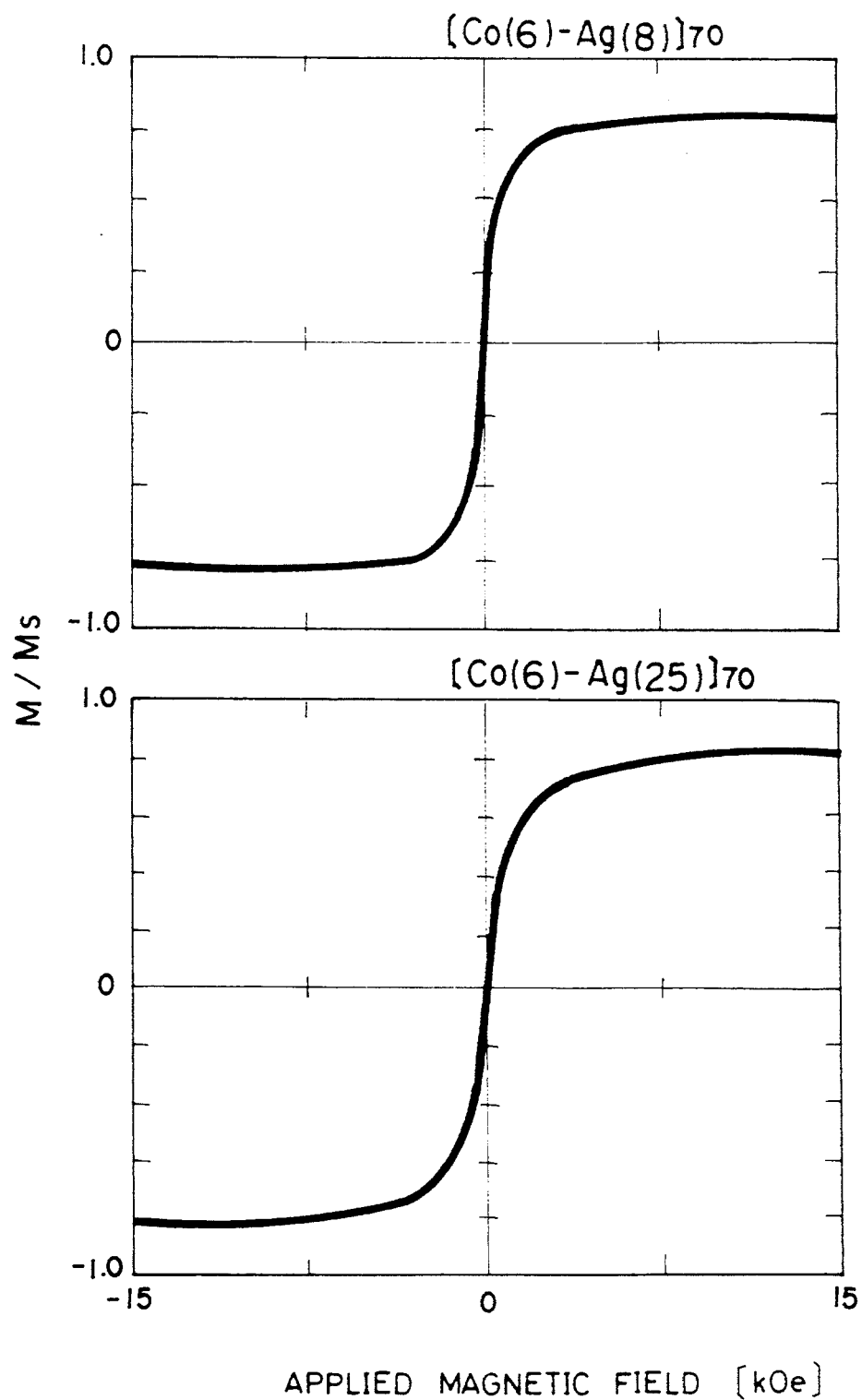
FIG. 7 shows magnetization curves of magnetic multilayers of Example 7 relative to a magnetic field applied thereto.

FIG. 7 in the lower half shows a magnetization versus applied magnetic field curve at t=25 Å. The squareness ratio was 0.2. FIG. 7 in the upper half shows a magnetization versus applied magnetic field curve at t=8 Å.

Figure 8:
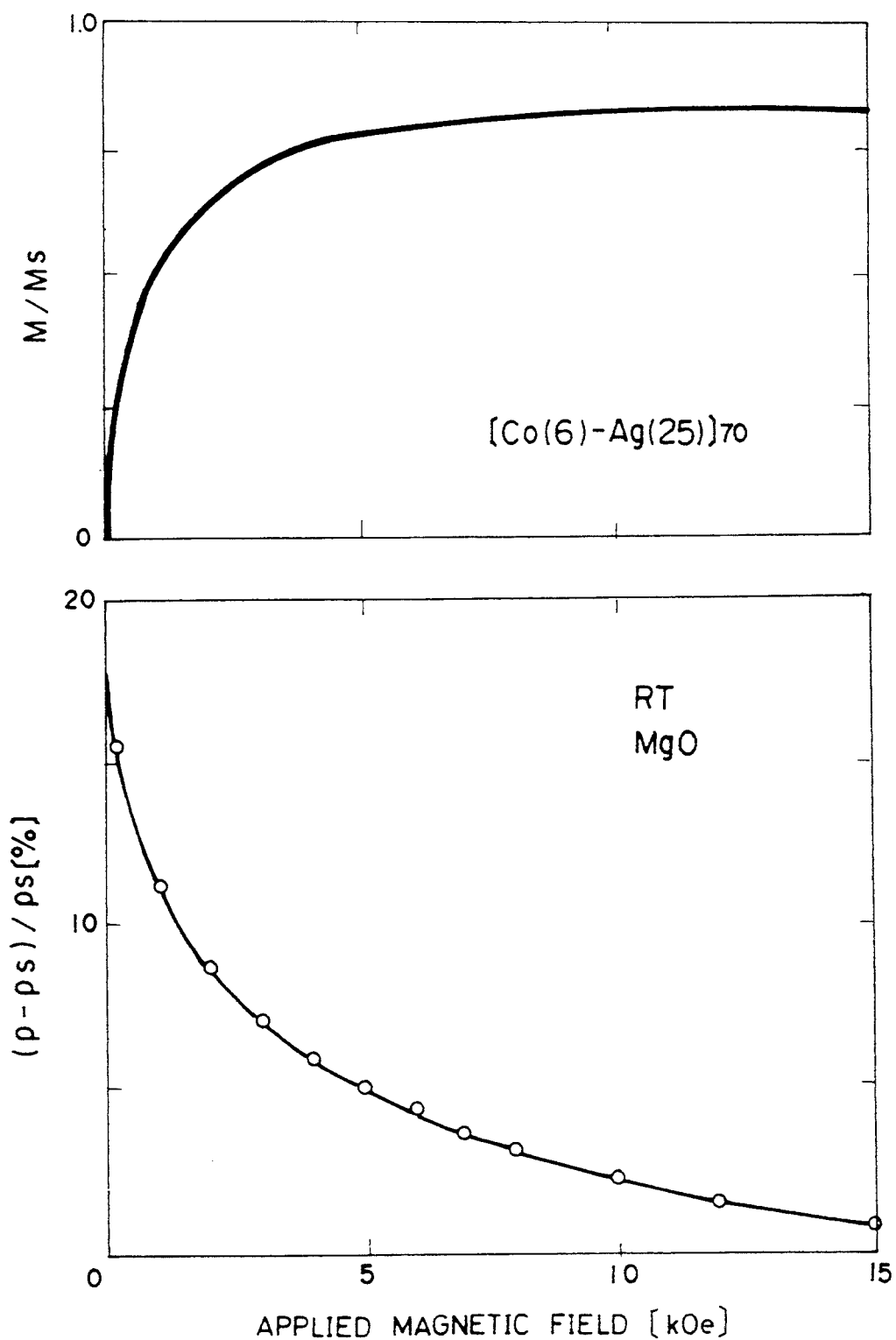
FIG. 8 shows a magnetization curve and a magnetoresistance change of a magnetic multilayer of Example 7 relative to a magnetic field applied thereto.

FIG. 8 shows a magnetization versus applied magnetic field curve at t=25 Å in the upper half and a magnetoresistance change at room temperature (RT) in the lower half. The magnetoresistance change rate is defined by the formula:

$$(\rho - \rho s)/\rho s \times 100\%$$

wherein ρs is a saturated resistivity in an applied magnetic field of 20 kOe, that is, a resistivity in ferromagnetic state (measuring current 290 μA), which is equal to 10 μΩcm in this example, and ρ is a resistivity in a varying applied magnetic field.

Figure 9:
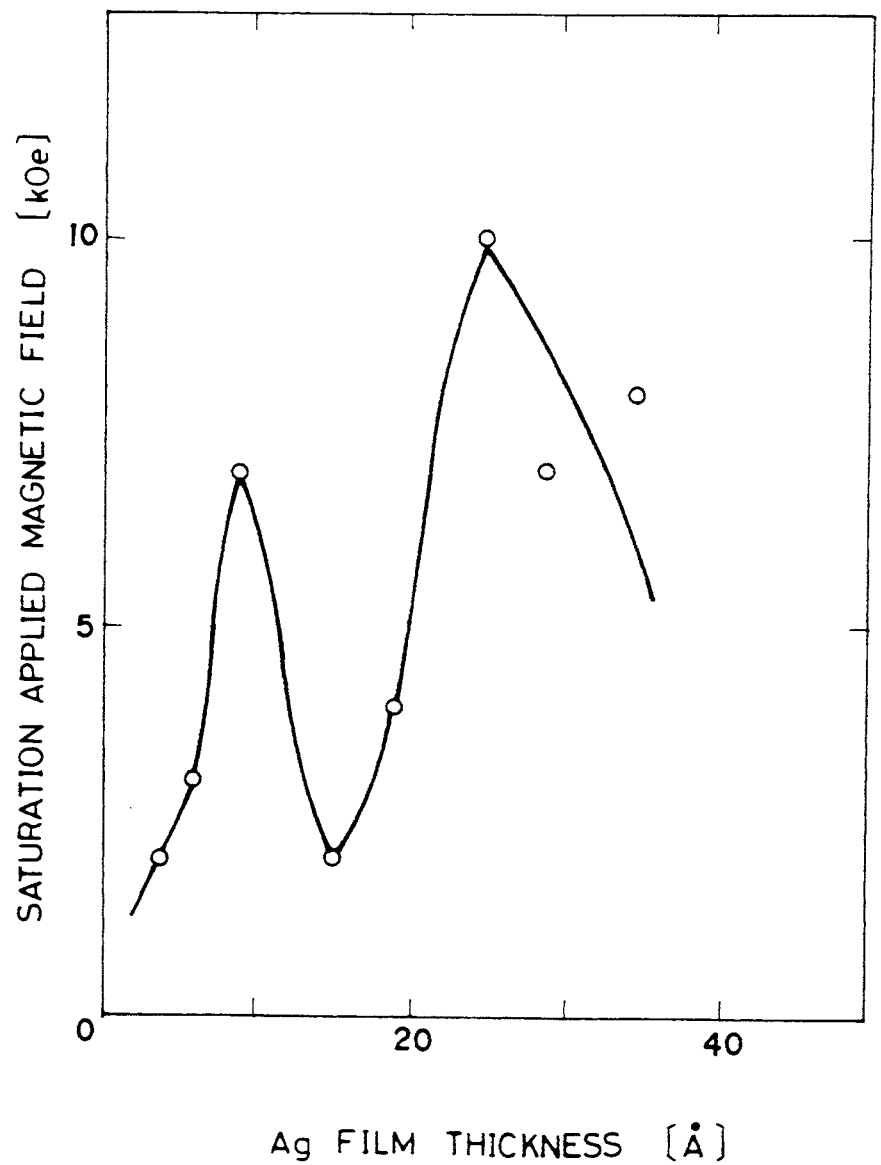
FIG. 9 shows how the saturation applied magnetic field varies with Ag film thickness in a magnetic multilayer of the invention.

FIG. 9 shows how the saturation applied magnetic field Hsat varies with the thickness of Ag film. It is seen that Hsat varies in a periodic oscillatory fashion with a varying thickness of Ag film. Maximum oscillation peaks appeared at t=9 Å and 25 Å. Antiferromagnetic coupling energy $J_{AF}$ was calculated to be 0.12 erg/cm² at the primary peak of 9 Å and 0.15 erg/cm² at the secondary peak of 25 Å based on the equation:

$$J_{AF} = Hsat \cdot Ms \cdot t(Co)/4$$

wherein Ms is saturation magnetization and t(Co) is the thickness of a Co film.

Figure 10:
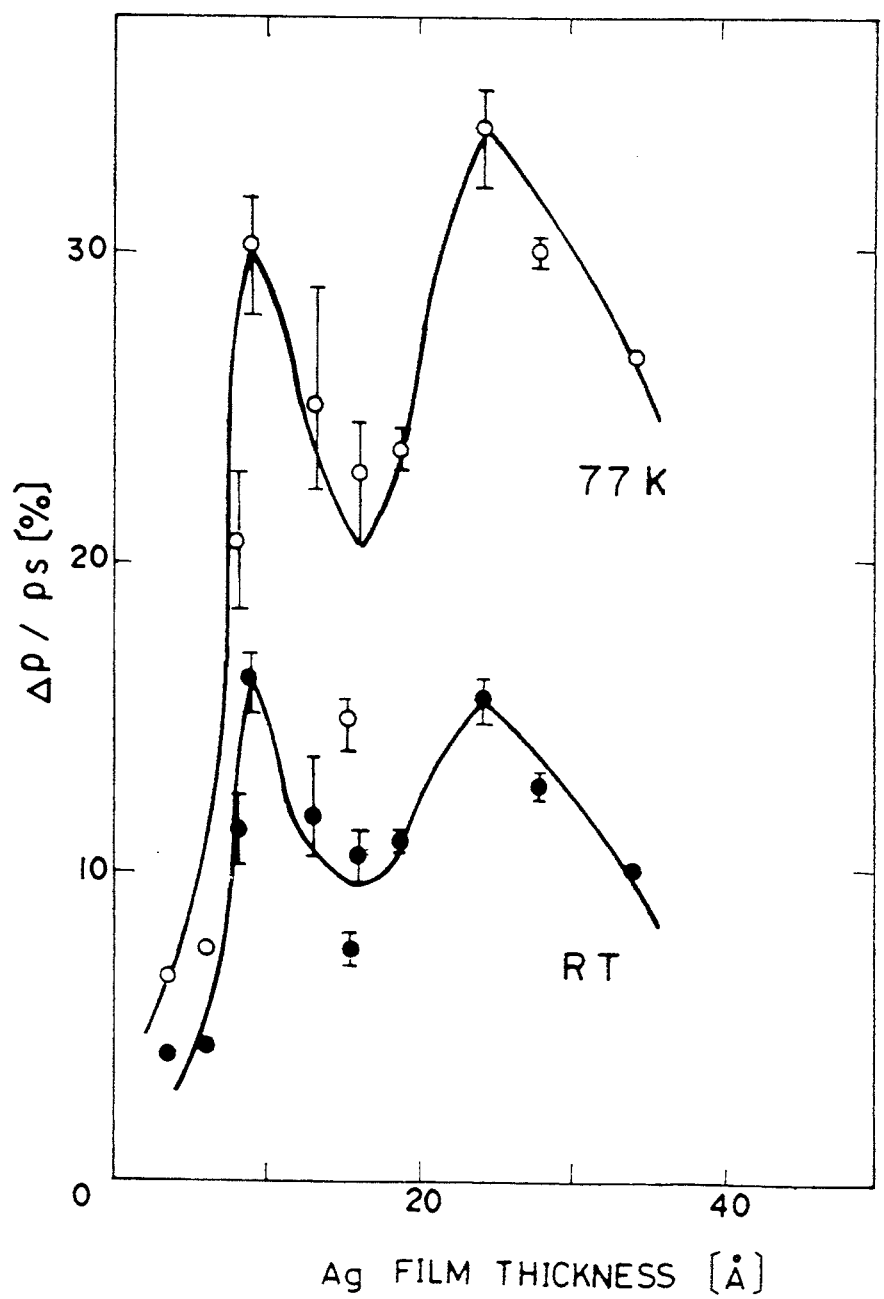
FIG. 10 shows how the magnetoresistance change varies with Ag film thickness in a magnetic multilayer of the invention.

FIG. 10 shows Δρ/ρs as a function of Ag film thickness wherein Δρ is an absolute change of resistivity and defined as Δρ=ρ0−ρs wherein ρ0 is the resistivity in an applied magnetic field of zero. It is seen that Δρ/ρs varies in a periodic oscillatory fashion with two peaks. At the primary maximum peak at t(Ag)=9 Å, the magnetoresistance change was as great as 16% at room temperature and 30% at 77K at Hsat=7 kOe. At the secondary maximum peak at t(Ag)=25 Å, the magnetoresistance change was as great as 16% at room temperature and 36% at 77K at Hsat=10 kOe. This suggests that a giant magnetoresistance change ranging from 10% to as high as 36% at room temperature will be available in an operating magnetic field of 2 to 10 kOe.

Figure 11:
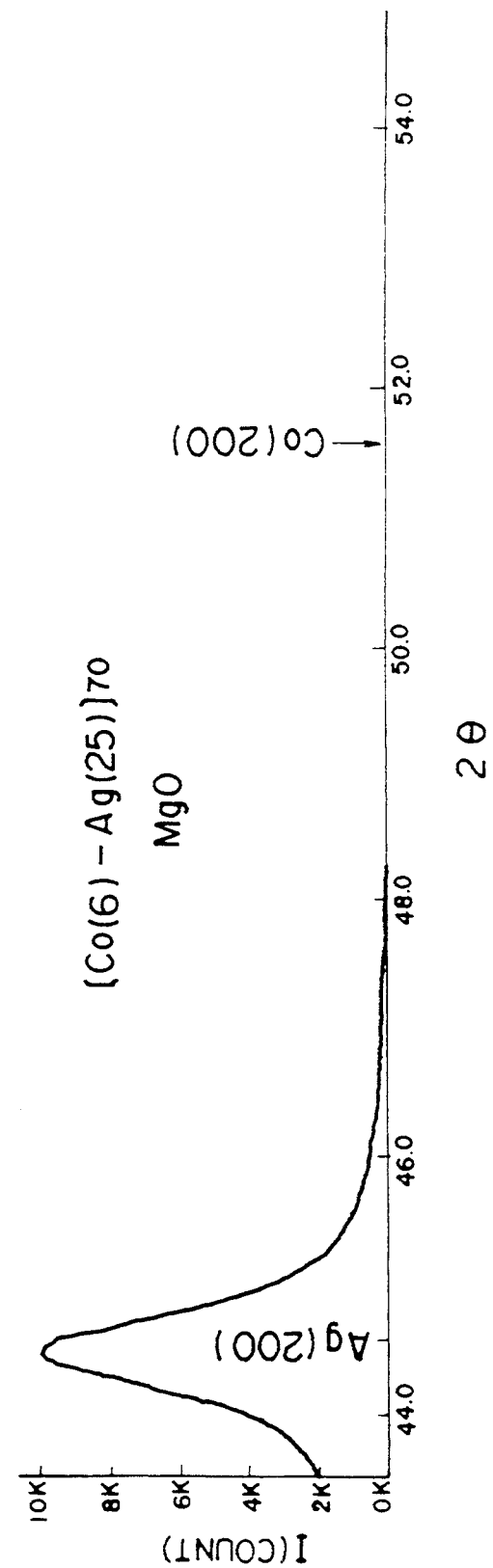
FIG. 11 is an X-ray diffraction pattern of a magnetic multilayer of the invention on MgO substrate.
Figure 12:
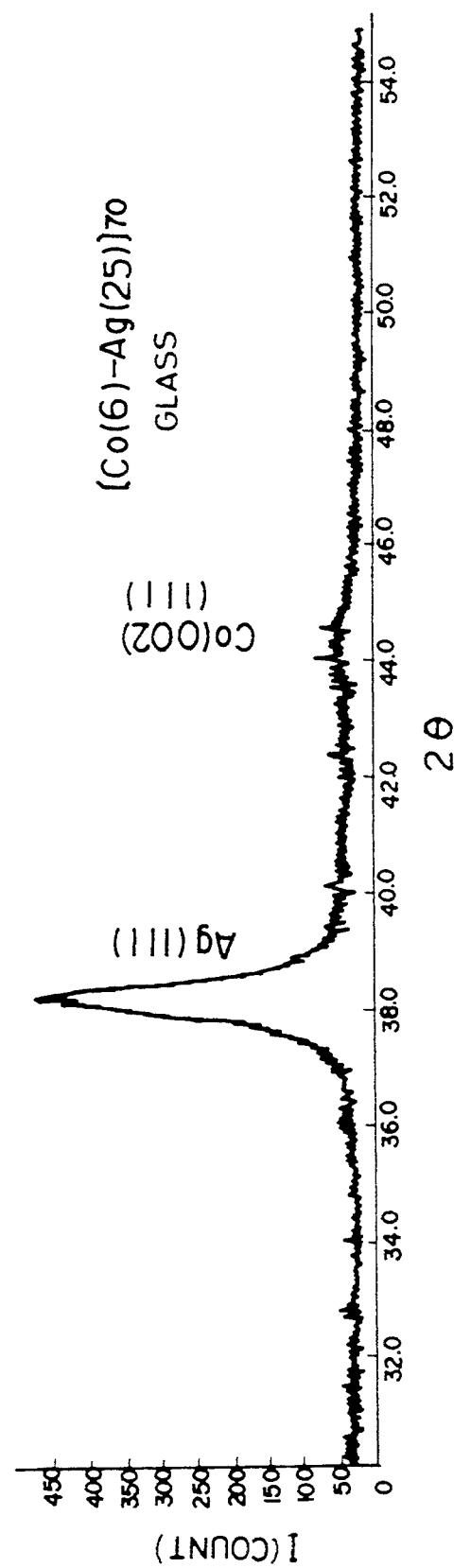
FIG. 12 is an X-ray diffraction pattern of a magnetic multilayer of the invention on glass substrate.

Equivalent results were obtained with glass substrates. FIGS. 11 and 12 show X-ray diffraction patterns of the magnetic multilayers on MgO and glass substrates, respectively. It is seen from FIG. 11 that epitaxial growth of (100) orientation took place in the film plane on the MgO substrate. It is seen from FIG. 12 that polycrystalline films formed on the glass substrate.

EXAMPLE 8

As in Example 1, 70 units each consisting of a Ni film of 7 Å and a Ag film of 10 Å were stacked, fabricating a magnetic multilayer sample designated [Ni(7)-Ag(10)]×70 having a total thickness of 0.12 μm. Its magnetization curve and magnetoresistance change at room temperature changed little. This was because the Ni layers as magnetic films had a Curie temperature lower than room temperature as indicated by analysis.

When measured at 77K, the magnetization curve showed antiferromagnetism as found with Co/Ag, and the magnetoresistance change $\Delta\rho/\rho s$ was 25%.

EXAMPLE 9

A magnetic multilayer designated [Ni(7)-Ag(22)]×70 was fabricated as in Example 8, which showed a $\Delta\rho/\rho s$ of 8% at 77K.

COMPARATIVE EXAMPLE 2

A magnetic multilayer designated [Ni(7)-Ag(70)]×70 was fabricated as in Example 8, which showed a $\Delta\rho/\rho s$ of 1% at 77K.

Equivalent results were obtained with other magnetic thin films based on Fe and Fe alloys.

There has been described a magnetic multilayer capable of giant magnetoresistance change in a lower magnetic field applied as compared with prior art magnetoresistance changing multilayers based on antiferromagnetic coupling. By virtue of the oscillatory periodic change of magnetic coupling energy, a magnetoresistance change of 1 to 40% is available in an operating magnetic field of 0.01 to 20 kOe. Since no limit is imposed on the type and temperature of a substrate on which the multilayer is stacked (for example, glass substrates are acceptable), the invention is advantageous for mass scale production. Any desired MR change is obtained by changing the direction of an external magnetic field applied thereto.

We claim:

1. A magnetoresistance effect element comprising a magnetic multilayer having a surface comprising
    alternating layers of at least one magnetic thin film containing at least one member selected from the group consisting of Fe, Co, and Ni, and at least one Ag thin film deposited by a molecular beam epitaxial method, wherein the particles deposited by the molecular beam epitaxial method had a kinetic energy of 0.01 to 5 eV and a center energy of 0.05 to 0.5 eV during deposition,
    said multilayer having an axis of easy magnetization in a plane parallel to the surface and a squareness ratio Br/Bs in the plane of up to 0.5.

2. The magneto-resistance effect element as claimed in claim 1, wherein said particles deposited by the molecular beam epitaxial method had a kinetic energy of 0.01 to 1.0 eV and a center energy of 0.05 to 0.5 eV during deposition.

3. The magnetic multilayer of claim 1 wherein the films are deposited under a pressure of about $10^{-11}$ to $10^{-7}$ Torr at a rate of about 0.01 to 10 Å/sec.

4. The magnetic multilayer of claim 3 wherein the films are deposited under a pressure at about $10^{-10}$ to $10^{-7}$ Torr at a rate of about 0.1 to 1.0 Å/sec.

5. A magnetoresistance effect element comprising a magnetic multilayer comprising
    alternating layers of at least one magnetic thin film containing at least one member selected from the group consisting of Fe, Co, and Ni, and at least one Ag thin film deposited by a molecular beam epitaxial method, wherein the particles deposited by the molecular beam epitaxial method had a kinetic energy of 0.01 to 5 eV, and a center energy of from 0.05 to 0.5 eV during deposition, and
    exhibiting antiferromagnetism.

6. The magneto-resistance effect element as claimed in claim 5, wherein said particles deposited by the molecular beam epitaxial method had a kinetic energy of 0.01 to 1.0 eV and a center energy of from 0.05 to 0.5 eV during deposition.

7. A magnetoresistance effect element comprising a magnetic multilayer comprising
    alternating layers of at least one magnetic thin film containing at least one member selected from the group consisting of Fe, Co, and Ni having a thickness of 2 to 60 Å, and at least one Ag thin film having a thickness of 2 to 60 Å deposited by a molecular beam epitaxial method, wherein the particles deposited by the molecular beam epitaxial method had a kinetic energy of 0.01 to 5 eV and a center energy of from 0.05 to 0.5 eV during deposition.

8. The magneto-resistance effect element as claimed in claim 7, wherein said particles deposited by the molecular beam epitaxial method had a kinetic energy of 0.01 to 1.0 eV and a center energy of from 0.05 to 0.5 eV during deposition.

9. The magnetic multilayer of claim 7 having a surface, said multilayer having an axis of easy magnetization in a plane parallel to the surface and a squareness ratio Br/Bs in the plane of up to 0.5.

* * * * *